(12) United States Patent
Joshi et al.

(10) Patent No.: US 10,388,590 B1
(45) Date of Patent: Aug. 20, 2019

(54) COOLING BOND LAYER AND POWER ELECTRONICS ASSEMBLIES INCORPORATING THE SAME

(71) Applicant: Toyota Motor Engineering & Manufacturing North America, Inc., Erlanger, KY (US)

(72) Inventors: Shailesh N. Joshi, Ann Arbor, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 15/885,115

(22) Filed: Jan. 31, 2018

(51) Int. Cl.
   *H01L 23/34* (2006.01)
   *H01L 23/473* (2006.01)
   (Continued)

(52) U.S. Cl.
   CPC ........ *H01L 23/473* (2013.01); *H01L 21/4871* (2013.01); *H01L 23/467* (2013.01); *H01L 24/27* (2013.01); *H01L 24/29* (2013.01); *H01L 24/32* (2013.01); *H01L 24/83* (2013.01); H01L 23/4735 (2013.01); H01L 2224/27001 (2013.01); H01L 2224/27462 (2013.01); H01L 2224/27464 (2013.01); H01L 2224/27849 (2013.01); H01L 2224/29005 (2013.01); H01L 2224/29016 (2013.01); H01L 2224/2929 (2013.01); H01L 2224/29082 (2013.01); H01L 2224/29109 (2013.01); H01L 2224/29111 (2013.01); H01L 2224/29113 (2013.01);
   (Continued)

(58) Field of Classification Search
   CPC ....... H01L 23/367; H01L 24/32; H01L 23/42; H01L 23/473; H01L 24/29; H01L 21/4871; H01L 23/467
   USPC ........................................ 257/712
   See application file for complete search history.

(56) References Cited

U.S. PATENT DOCUMENTS

| 5,057,908 A | 10/1991 | Weber |
| 7,872,563 B2 | 1/2011 | Braun et al. |

(Continued)

OTHER PUBLICATIONS

Dusseault, Thomas J., "Inverse opals for fluid delivery in electronics cooling systems"; URL: https://nanoheat.stanford.edu/sites/default/files/publications/dusseault_final.pdf.

*Primary Examiner* — Theresa T Doan
(74) *Attorney, Agent, or Firm* — Dinsmore & Shohl LLP

(57) ABSTRACT

A cooling bond layer for a power electronics assembly is provided. The cooling bond layer includes a first end, a second end spaced apart from the first end, a metal matrix extending between the first end and the second end, and a plurality of micro-channels extending through the metal matrix from the first end to the second end. The plurality of micro-channels are configured for a cooling fluid to flow through and remove heat from the cooling bond layer. In some embodiments, the plurality of micro-channels are cylindrical shaped micro-channels. In such embodiments, the plurality of micro-channels may have a generally constant average inner diameter along a thickness of the cooling bond layer. In the alternative, the plurality of micro-channels may have a graded average inner diameter along a thickness of the cooling bond layer. In other embodiments, the plurality of micro-channels may have a wire mesh layered structure.

17 Claims, 16 Drawing Sheets

(51) Int. Cl.
  *H01L 21/48* (2006.01)
  *H01L 23/00* (2006.01)
  *H01L 23/467* (2006.01)

(52) U.S. Cl.
  CPC ........... *H01L 2224/29139* (2013.01); *H01L 2224/29147* (2013.01); *H01L 2224/29155* (2013.01); *H01L 2224/32245* (2013.01); *H01L 2224/8382* (2013.01); *H01L 2224/8384* (2013.01); *H01L 2224/83801* (2013.01); *H01L 2924/014* (2013.01); *H01L 2924/0695* (2013.01); *H01L 2924/07025* (2013.01); *H01L 2924/1203* (2013.01); *H01L 2924/13055* (2013.01); *H01L 2924/13091* (2013.01)

(56) References Cited

U.S. PATENT DOCUMENTS

| | | | |
|---|---|---|---|
| 8,030,754 B2 | 10/2011 | Hartwell et al. | |
| 9,120,190 B2 | 9/2015 | Schwartz et al. | |
| 2002/0106457 A1* | 8/2002 | Lee | C23C 14/042 427/404 |
| 2006/0090489 A1* | 5/2006 | Haws | H05K 5/0213 62/176.6 |
| 2010/0288479 A1 | 11/2010 | Meng et al. | |
| 2016/0207041 A1 | 7/2016 | Weber | |
| 2016/0358842 A1 | 12/2016 | Milne | |

\* cited by examiner

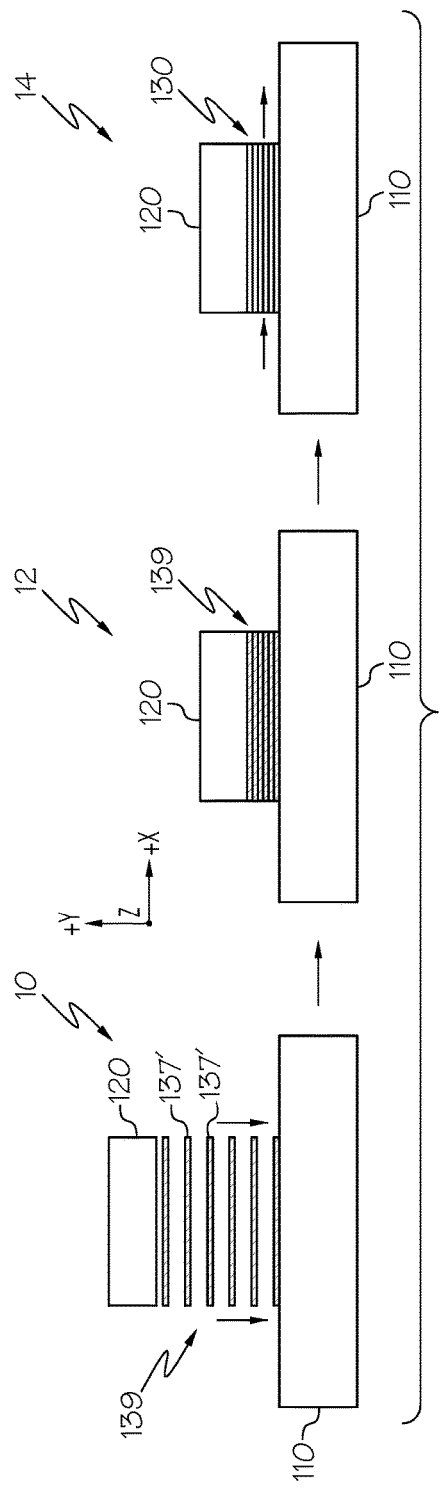
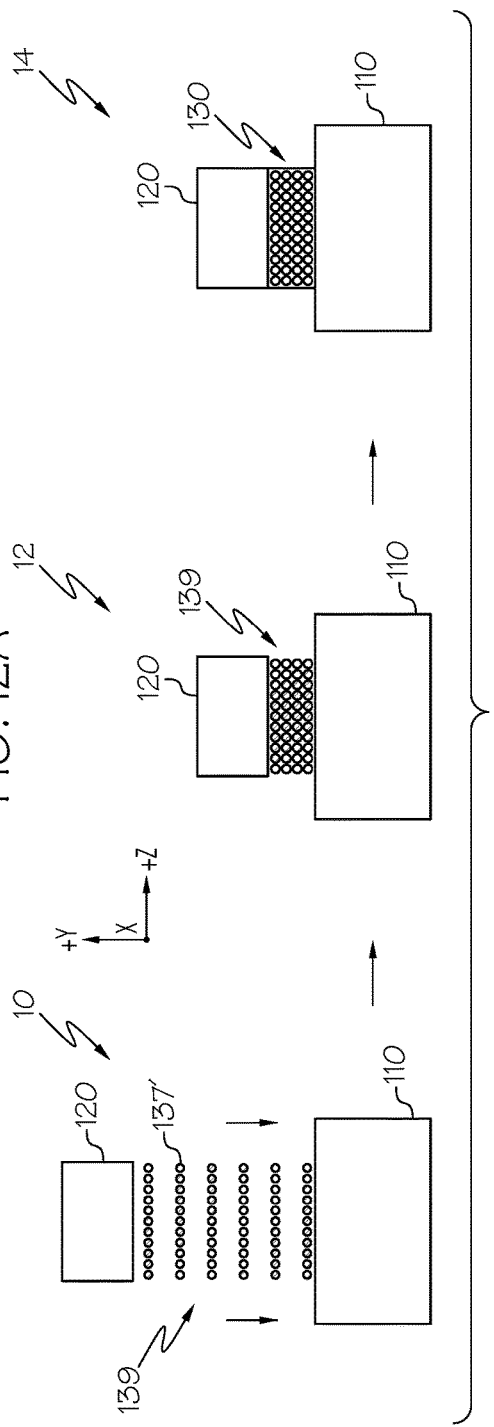

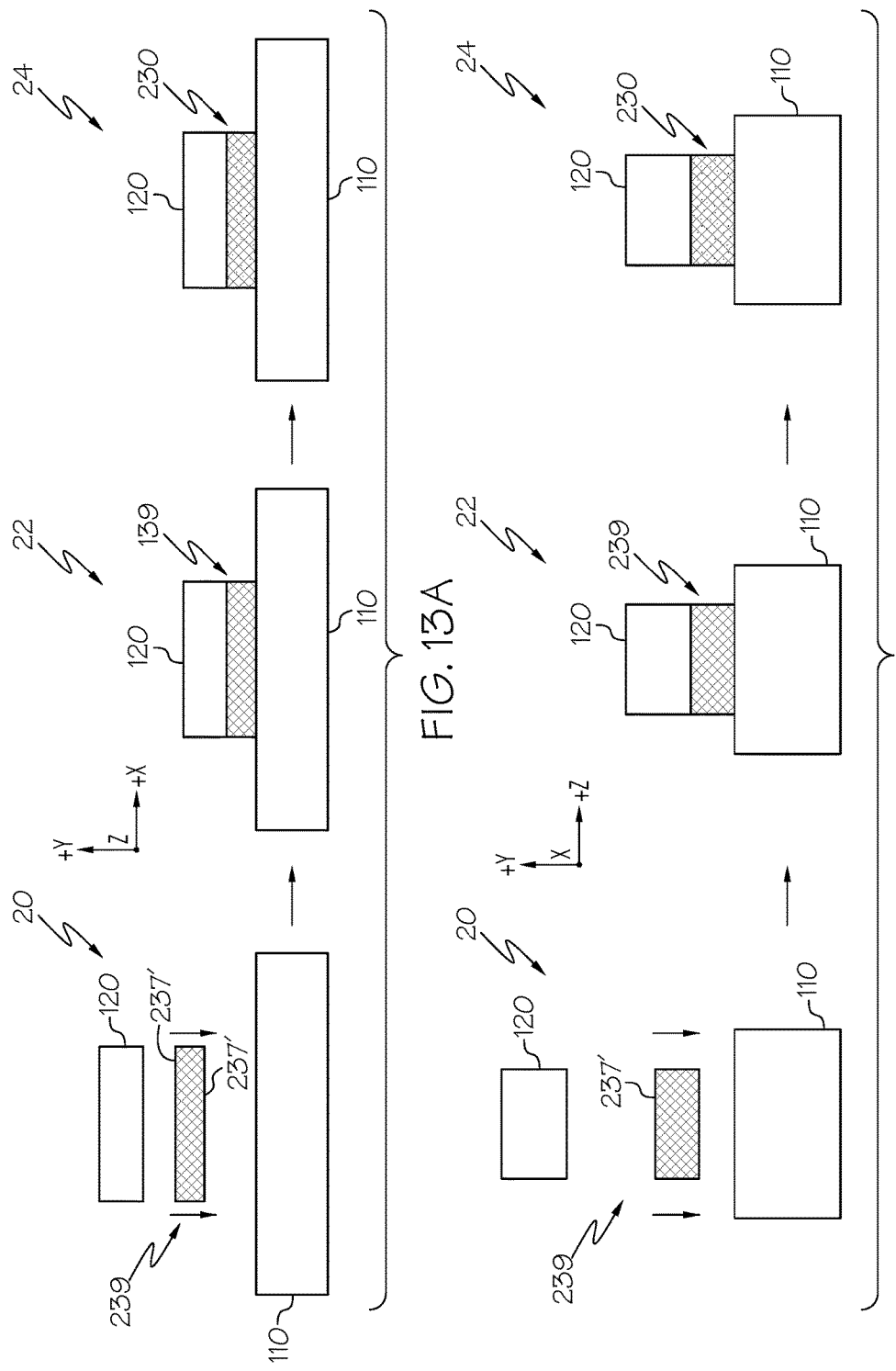

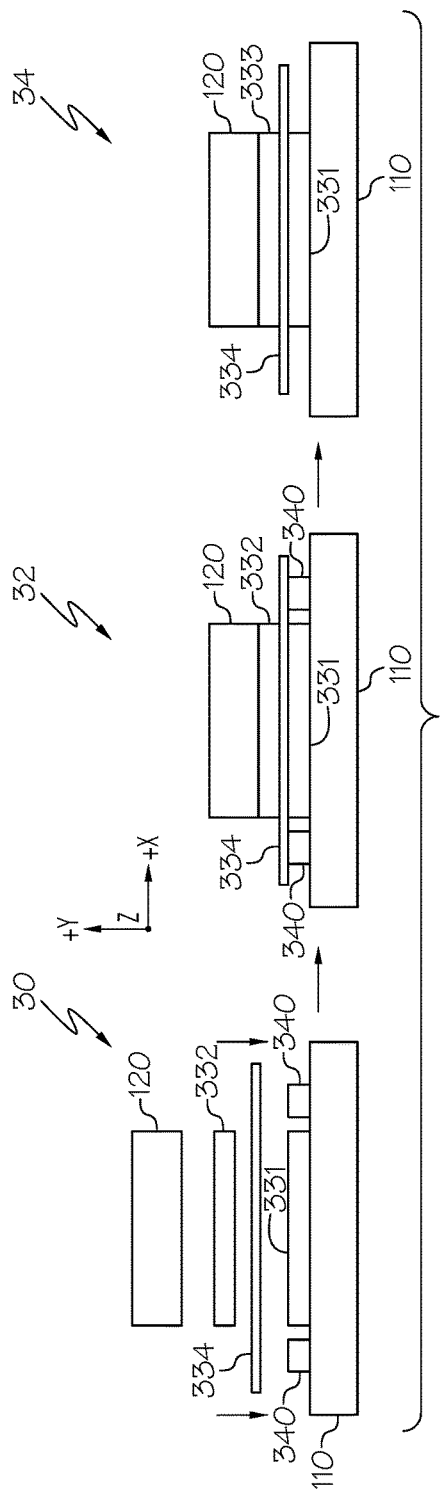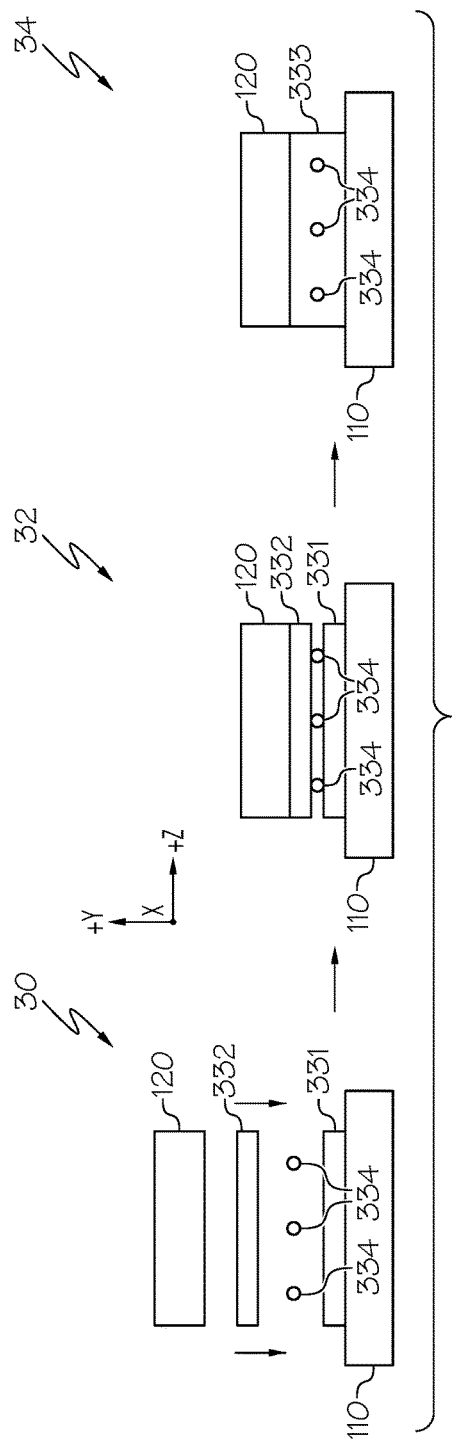

US 10,388,590 B1

COOLING BOND LAYER AND POWER ELECTRONICS ASSEMBLIES INCORPORATING THE SAME

TECHNICAL FIELD

The present specification generally relates to bonding materials, and more particularly, to bonding materials that bond semiconductor devices to substrates and provide cooling of the semiconductor devices.

BACKGROUND

Power electronics devices are often utilized in high-power electrical applications, such as inverter systems for hybrid electric vehicles and electric vehicles. Such power electronics devices include power semiconductor devices such as power IGBTs and power transistors thermally bonded to a substrate. The substrate may then be further bonded to a cooling structure, such as a heat sink. With advances in battery technology and increases in electronics device packaging density, operating temperatures of power electronics devices have increased and are currently approaching 200° C. which require increasing the size of the cooling structures. Accordingly, alternative cooling structures for power electronics devices are desired.

SUMMARY

In one embodiment, a cooling bond layer for a power electronics assembly includes a first end, a second end spaced apart from the first end, a metal matrix extending between the first end and the second end, and a plurality of micro-channels extending through the metal matrix from the first end to the second end. The plurality of micro-channels are configured for a cooling fluid to flow through and remove heat from the cooling bond layer. In some embodiments, the plurality of micro-channels are cylindrical shaped micro-channels. In such embodiments, the plurality of micro-channels may have a generally constant average inner diameter as a function of a thickness of the cooling bond layer. In the alternative, the plurality of micro-channels may have a graded average inner diameter as a function of the thickness of the cooling bond layer. In other embodiments, the plurality of micro-channels may be in the form of a wire mesh layer.

In another embodiment, a power electronics assembly includes a substrate, a semiconductor device, and a cooling bond layer disposed between and bonded to the semiconductor device and the substrate. The cooling bond layer includes a first end and a second end spaced apart from the first end, a metal matrix extending between the first end and the second end, and a plurality of micro-channels extending through the metal matrix from the first end to the second end. A cooling fluid circuit extending through the cooling bond layer may be included and be configured to remove heat transferred to the cooling bond layer from the semiconductor device. In some embodiments, the plurality of micro-channels are cylindrical shaped micro-channels. In such embodiments, the plurality of micro-channels may have a generally constant average inner diameter as a function of a thickness of the cooling bond layer. In the alternative, the plurality of micro-channels may have a graded average inner diameter as a function of the thickness of the cooling bond layer. In other embodiments, the plurality of micro-channels may be in the form or a wire mesh layer. The metal matrix of the cooling bond layer may be formed by reflow soldering in which a liquid soldering material flows and solidifies around a template. The template may have the shape or form of the plurality of micro-channels and may be removed from the metal matrix to form the plurality of micro-channels.

In yet another embodiment, a process for manufacturing a power electronics assembly includes positioning a template and soldering material between a substrate and a semiconductor device, forming a metal matrix around the template, and bonding the substrate to the semiconductor device. The template is removed from the metal matrix to form a cooling bond layer with a plurality of micro-channels within the metal matrix. The cooling bond layer includes a first end, a second end spaced apart from the first end, and the metal matrix extends between the first end and the second end. Also, the plurality of micro-channels extend through the metal matrix from the first end to the second end and are configured for cooling fluid to flow there through. In some embodiments, the metal matrix if formed by a reflow soldering process. The template may include a plurality of cylindrical shaped members that are removed from the metal matrix using a mechanical force. In the alternative, or in addition to, the template may include a plurality of tubes that are not removed from the metal matrix.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 12A schematically depicts a side view of a process for forming the power electronics assembly in FIG. 1 with the cooling bond layer in FIG. 2A according to one or more embodiments shown and described herein;

FIG. 12B schematically depicts an end view of the process in FIG. 12A;

FIG. 13A schematically depicts a side view of a process for forming the power electronics assembly in FIG. 1 with the cooling bond layer in FIG. 9B according to one or more embodiments shown and described herein;

FIG. 13B schematically depicts an end view of the process in FIG. 13A;

FIG. 14A schematically depicts a side view of a process for forming the power electronics assembly in FIG. 1 with the cooling bond layer in FIG. 11A according to one or more embodiments shown and described herein;

FIG. 14B schematically depicts an end view of the process in FIG. 14A; and

DETAILED DESCRIPTION

A power electronics assembly with a power semiconductor device (semiconductor device) bonded to a substrate with a cooling bond layer is provided. As used herein, the term "cooling bond layer" refers to a bond layer disposed between and bonded to a semiconductor device and a substrate, wherein the bond layer is configured to extract heat from the semiconductor device via the flow of a cooling fluid through the bond layer. The cooling bond layer comprises a first end, a second end spaced apart from the first end, a metal matrix extending between the first end and the second end, and a plurality of micro-channels extending through the metal matrix. As used herein, the phrase "metal matrix" refers to a generally non-porous metal or alloy layer extending between the plurality of micro-channels and the term "micro-channels" refers to hollow passageways with an internal dimension less than 1000 micrometers (μm) that extend through the metal matrix. The metal matrix of the cooling bond layer may be formed by flowing a liquid soldering material around a template, e.g., using a reflow soldering process. The term "template" as used herein refers to a physical form or object that provides a pattern within the metal matrix. The template and a soldering material (solid) may be positioned between a semiconductor device and a substrate and the metal matrix may be formed and bonded to the semiconductor device and the substrate during forming of the metal matrix around the template. The template may be removed from the metal matrix thereby providing the plurality of micro-channels. That is, the template may be a sacrificial matrix for the plurality of micro-channels. A cooling fluid circuit comprising the cooling bond layer may be configured for a cooling fluid to flow through the plurality of micro-channels and assist in removing heat from the semiconductor device during operation of the power electronics assembly. The cooling bond layer may also provide an electrical conduit (i.e., electrical contact) between the semiconductor device and the substrate. Various embodiments of cooling bond layers and power electronics assemblies using cooling bond layers will be described in more detail herein.

Figure 1:
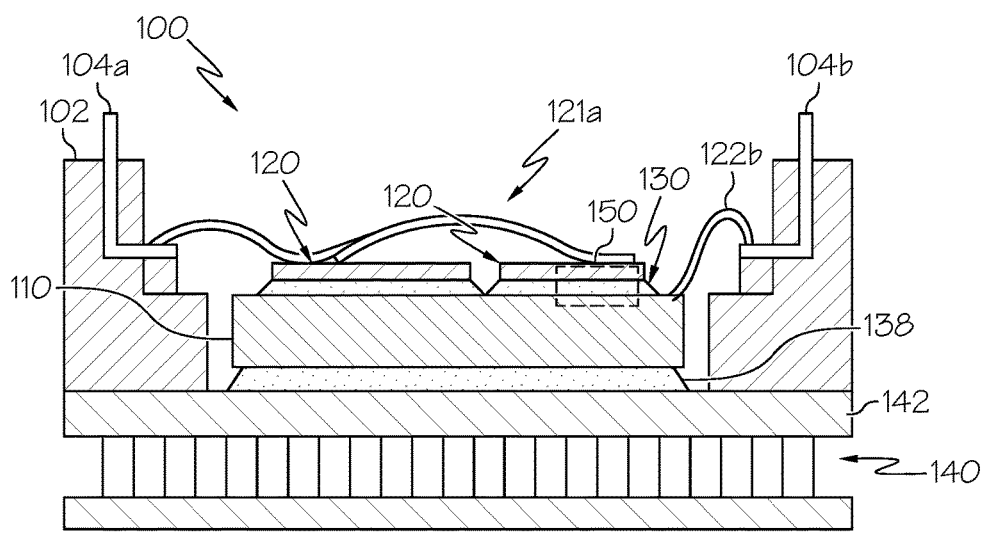
FIG. 1 schematically depicts a side view of a power electronics assembly having a power semiconductor device bonded to a substrate with a cooling bond layer according to one or more embodiments shown and described herein.

Referring initially to FIG. 1, as a non-limiting example, a power electronics assembly 100 is schematically illustrated. The power electronics assembly 100 generally comprises a substrate 110, two semiconductor devices 120 bonded to the substrate 110 via a cooling bond layer 130, a cooling structure 140, and a package housing 102.

The thicknesses of the substrate 110 and the semiconductor devices 120 may depend on the intended use of the power electronics assembly 100. In one embodiment, the substrate 110 has a thickness within the range of about 2.0 mm to about 4.0 mm, and the semiconductor device 120 has a thickness within the range of about 0.1 mm to about 0.3 mm. For example and without limitation, the substrate 110 may have a thickness of about 3.0 mm and the semiconductor device 120 may have a thickness of about 0.2 mm. It should be understood that other thicknesses may be utilized.

The substrate 110 may be formed from a thermally conductive material such that heat from the semiconductor devices 120 is transferred to the cooling structure 140. The substrate 110 may any type of substrate for power semiconductor device assemblies known to those skilled in the art. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. The semiconductor devices 120 may be formed from a wide band gap semiconductor material suitable for the manufacture or production of power semiconductor devices such as power insulated-gate bipolar transistors (IGBTs) and power transistors. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), boron nitride (BN), diamond, and the like. In embodiments, the substrate 110 and the semiconductor devices 120 may comprise a coating, e.g., nickel (Ni) plating, to assist in the TLP sintering of the semiconductor devices 120 to the substrate 110 as discussed in greater detail below.

As depicted in FIG. 1, a substrate 110 is bonded to two semiconductor devices 120 via the cooling bond layer 130. More or fewer semiconductor devices 120 may be attached to the substrate 110. In some embodiments, heat generating devices other than power semiconductor devices may be attached to the substrate 110. The semiconductor devices 120 may be power semiconductor devices such as IGBTs, power diodes, power metal-oxide-semiconductor field-effect transistors (MOSFETs), power transistors, and the like. In one embodiment, the semiconductor devices 120 of one or more power electronics assemblies are electrically coupled to form an inverter circuit or system for vehicular applications, such as for hybrid vehicles or electric vehicles, for example.

The substrate 110 may be thermally coupled to the cooling structure 140 via a bond layer 138. In one embodiment, the cooling structure 140 comprises an air-cooled heat sink. In an alternative embodiment, the cooling structure 140 comprises a liquid-cooled heat sink, such as a jet impingement or channel-based heat sink device that may be in fluid communication with the cooling bond layer 130. The substrate 110 of the illustrated embodiment is directly bonded to a first surface 142 of the cooling structure 140 via the bond layer 138 without any additional interface layers (e.g., additional metal base plates). The substrate 110 may be bonded to the cooling structure 140 using a variety of bonding techniques, such as by TLP sintering, solder, brazing, or diffusion bonding, for example. However, in an alternative embodiment, one or more thermally conductive interface layers may be positioned between the substrate 110 and the cooling structure 140. In another alternative embodiment, the power electronics assembly 100 does not include the cooling structure 140. That is, the cooling bond layer 130 removes sufficient heat from the semiconductor device 120 such that the cooling structure 140 is not needed.

Still referring to FIG. 1, the substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example. In other embodiments, the package housing 102 may be coupled to the substrate 110. In still other embodiments, no package housing is provided.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 121a, and the second electrical contact 104b is electrically coupled to a second surface of the semiconductor devices 120 via a second electrical wire 121b and the substrate 110. It should be understood that other electrical and mechanical configurations are possible, and that embodiments are not limited by the arrangement of the components illustrated in the figures.

Figure 2A:
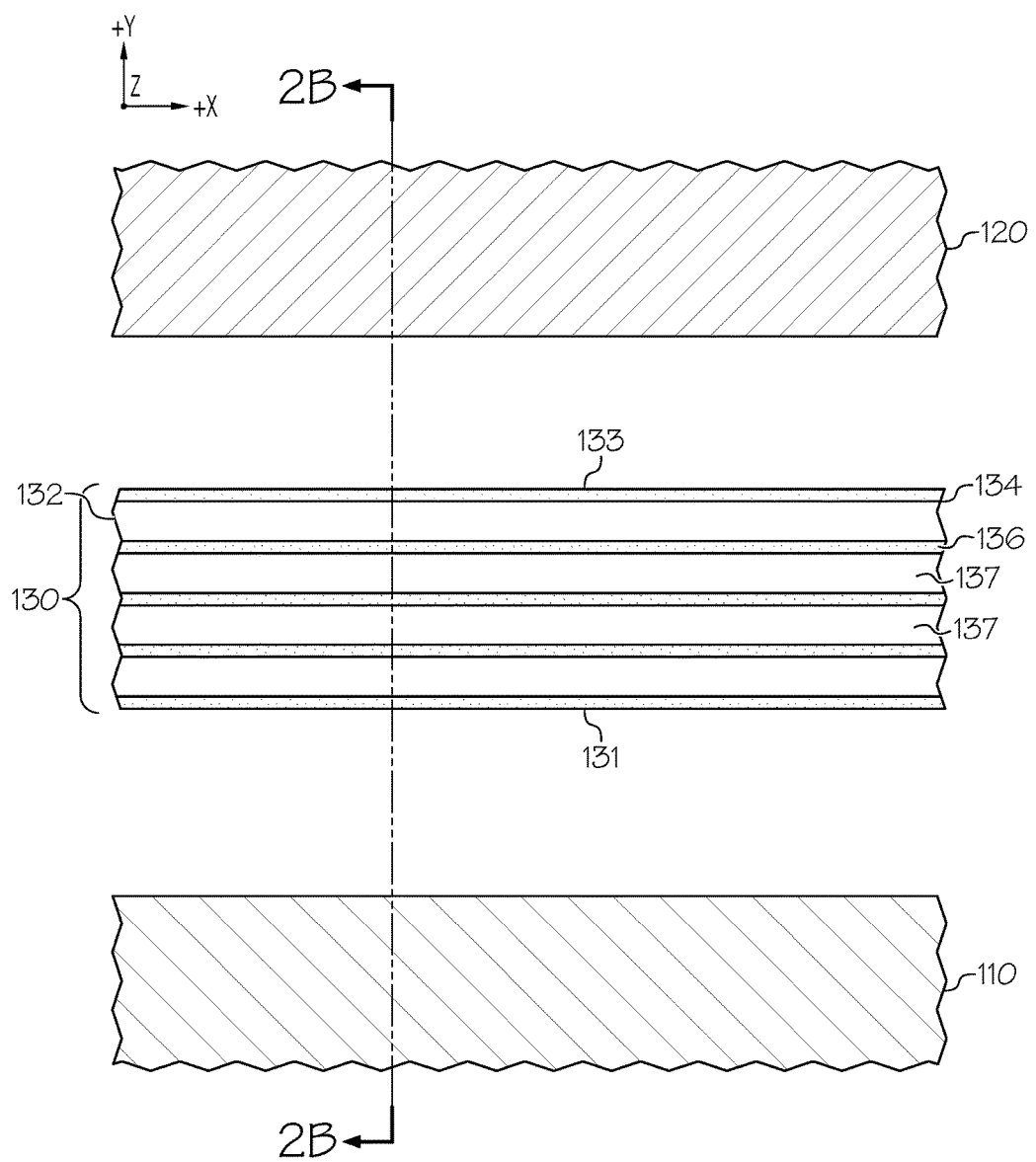
FIG. 2A schematically depicts an exploded side view of the cooling bond layer in FIG. 1 according to one or more embodiments shown and described herein.
Figure 2B:
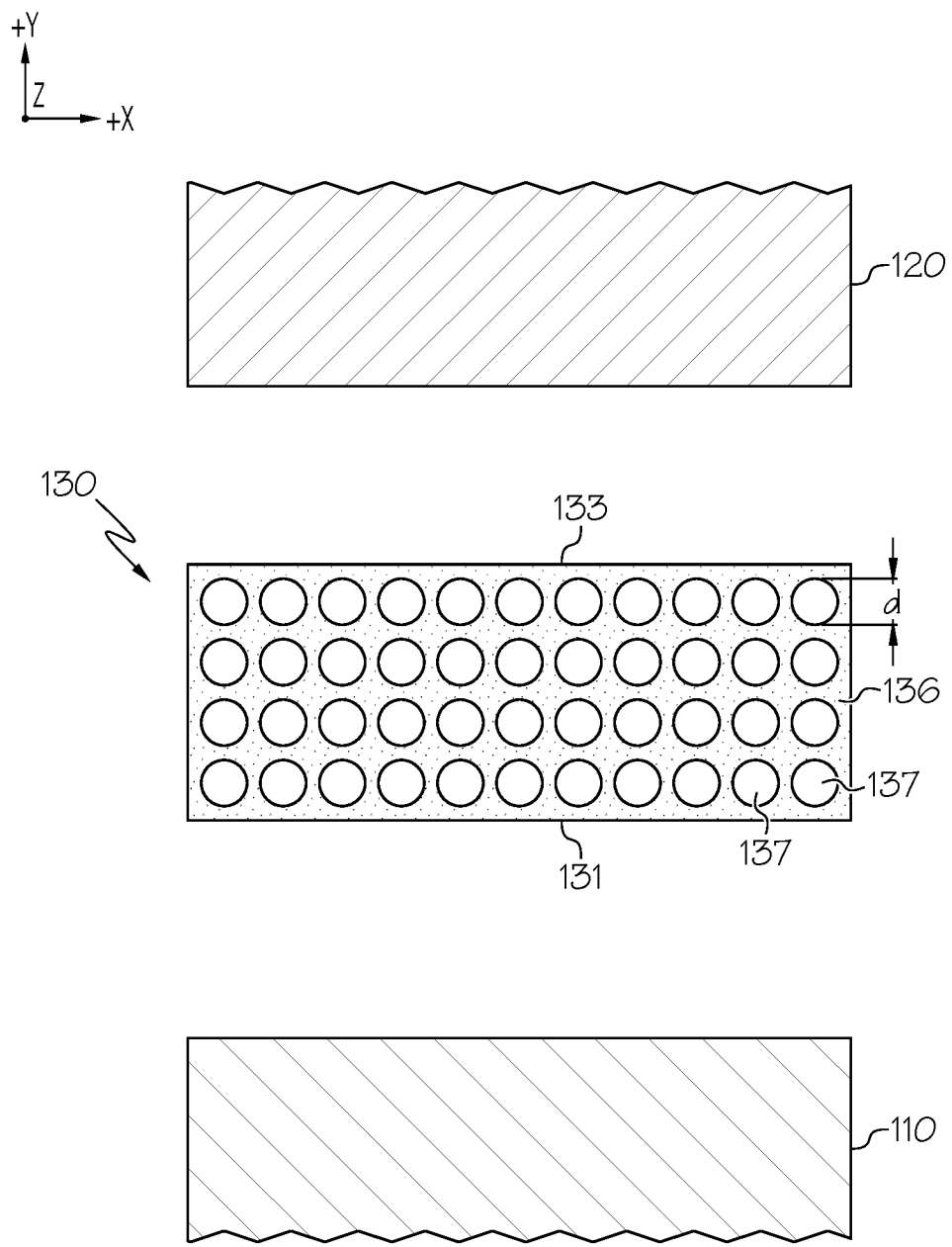
FIG. 2B schematically depicts a view of section 2B-2B in FIG. 2A.

Referring now to FIGS. 2A-2B, an exploded side view of the region designated by box 150 in FIG. 1 before bonding the semiconductor devices 120 to the substrate 110 is schematically depicted in FIG. 2A and a view of section 2B-2B in FIG. 2A is schematically depicted in FIG. 2B. In embodiments, the substrate 110 is bonded to the semiconductor device 120 via reflow soldering to form and solder the cooling bond layer 130 to the substrate 110 and the semiconductor device 120 as discussed in more detail below with reference to FIGS. 12A-12B. It should be understood that other bonding techniques and processes may be utilized to form and bond the cooling bond layer 130 to the substrate 110 and the semiconductor device 120. The cooling bond layer 130 includes a lower surface 131, an upper surface 133, a first end 132, and a second end 134 spaced apart (+X direction) from the first end 132. The cooling bond layer 130 includes a metal matrix 136 with a plurality of tubeless micro-channels 137 disposed within the metal matrix 136 and extending from the first end 132 to the second end 134.

Figure 3:
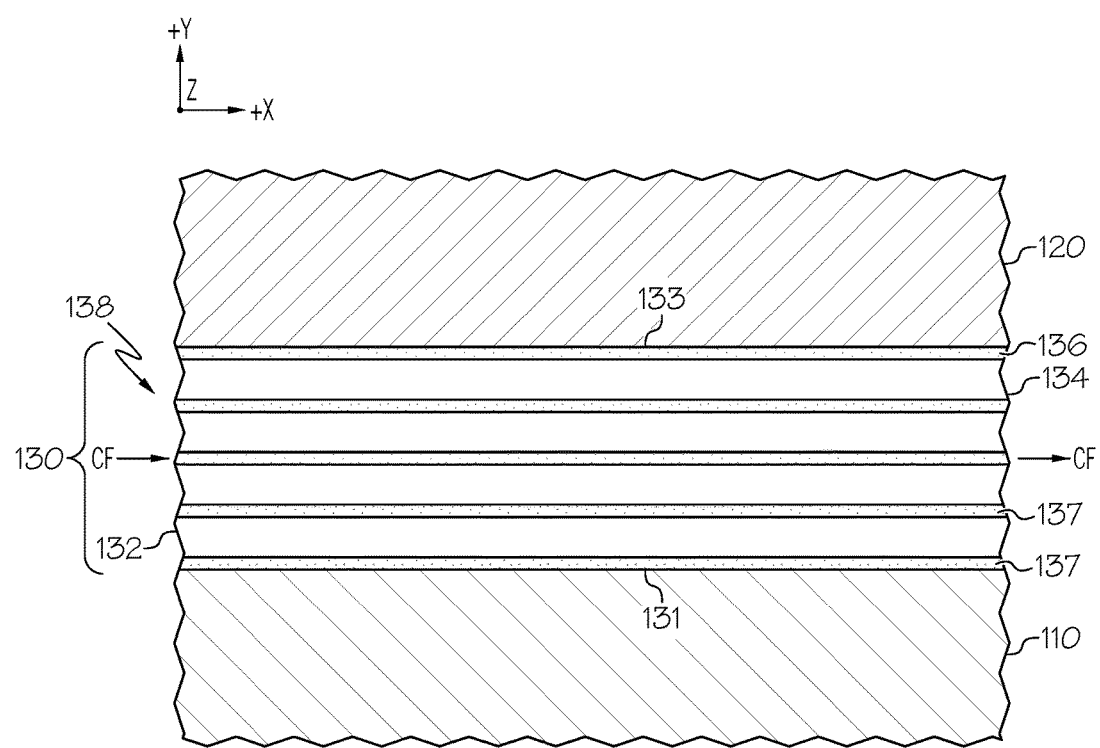
FIG. 3 schematically depicts the cooling bond layer in FIG. 2A bonded to the power electronics assembly according to one or more embodiments shown and described herein.

As used herein, the phrase "tubeless micro-channel" refers to a micro-channel without a tube between the metal matrix and the hollow passageway of the micro-channel. In embodiments, the cooling bond layer 130 may be disposed between and in direct contact with the substrate 110 and the semiconductor device 120 as depicted in FIG. 3. Accordingly, the lower surface 131 of the cooling bond layer 130 may be in direct contact with the substrate 110 and the upper surface 133 may be in direct contact with the semiconductor device 120. In other embodiments, the cooling bond layer 130 may be disposed between but not be in direct contact with the substrate 110 and the semiconductor device 120. That is, one or more additional layers may be disposed between the lower surface 131 of the cooling bond layer 130 and the substrate 110 and/or one or more additional layers may be disposed between the upper surface 133 and the semiconductor device 120.

In some embodiments, the plurality of tubeless micro-channels 137 may be cylindrical shaped micro-channels with a circular cross-section (Y-Z plane) and an average inner diameter 'd1' as depicted in FIG. 2B. In other embodiments (not shown), the plurality of tubeless micro-channels 137 may not be cylindrical shaped and may have a square cross-section, a rectangular cross-section, an elliptical cross-section, and the like. As depicted in FIGS. 2A-2B, in some embodiments, the plurality of tubeless micro-channels 137 may be regularly spaced apart from each other in the form of an array. As used herein, the term "array" refers to a pattern of micro-channels arranged in rows and/or columns within a metal matrix with equal distances between the rows and/or columns. In such embodiments, the plurality of tubeless micro-channels 137 may be in the form of two or more different arrays. In other embodiments, the plurality of tubeless micro-channels 137 may not be in the form of an array, i.e., the plurality of tubeless micro-channels 137 may not be regularly spaced apart from each other. In still other embodiments, a first portion of the plurality of tubeless micro-channels 137 may be in the form of an array and a second portion of the plurality of tubeless micro-channels 137 may not be in the form of an array. As depicted in FIG. 3, a cooling fluid 'CF' may flow through the plurality of tubeless micro-channels 137 as part of a cooling fluid circuit 135 comprising the cooling bond layer 130 for the power electronics assembly 100. Non-limiting examples of the cooling fluid CF include dielectric cooling fluids such as aromatics, silicate-ester, aliphatics, silicones, fluorocarbons, and the like.

Figure 4:
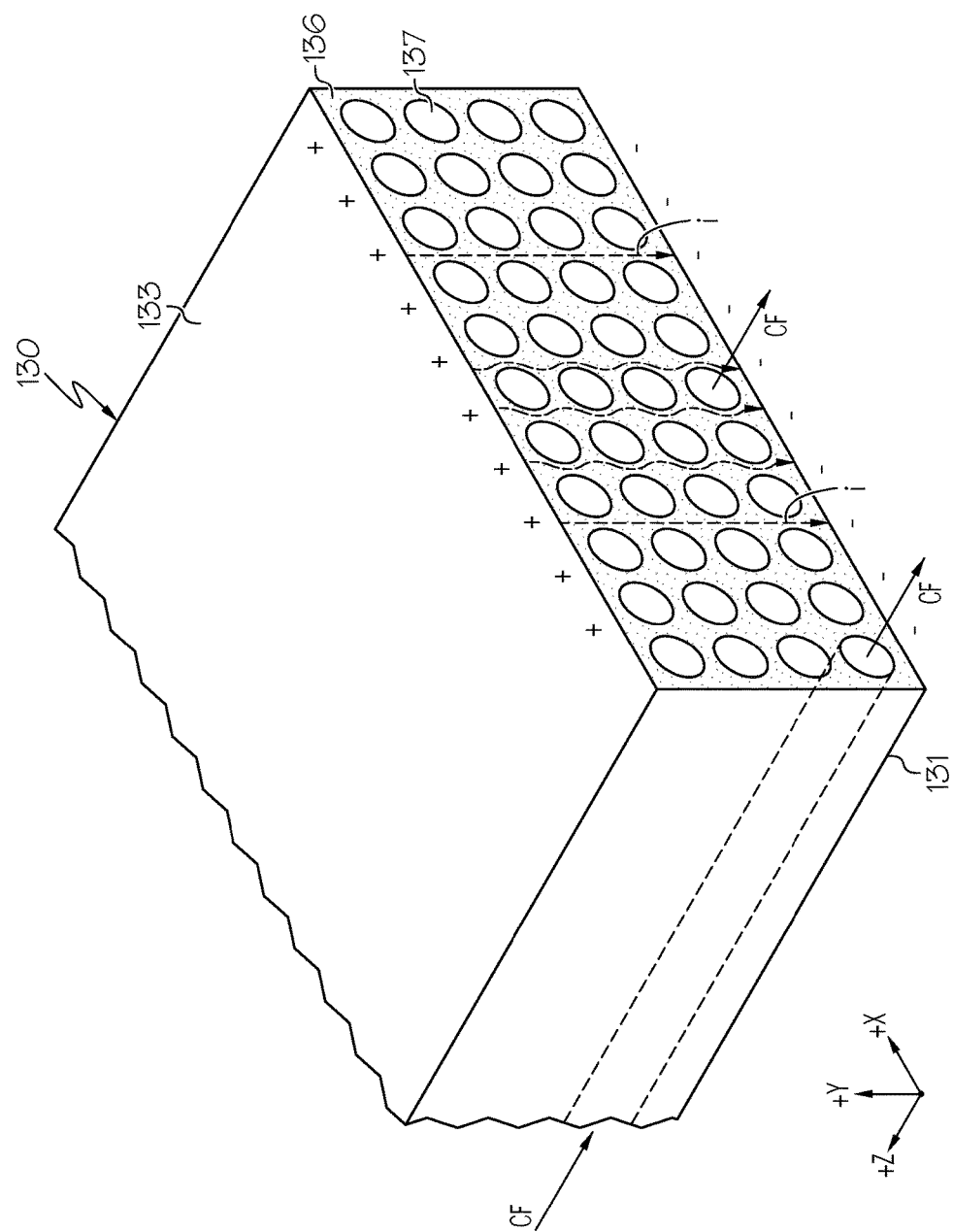
FIG. 4 schematically depicts an isolated perspective view of the cooling bond layer in FIG. 3 with cooling fluid and electrical current passing through the cooling bond layer.

Referring now to FIG. 4, one non-limiting example of the cooling bond layer 130 providing an electrical conduit (i.e., electrical contact) between a semiconductor device and a substrate is schematically depicted. Particularly, an isolated perspective view of the cooling bond layer 130 shown in FIG. 3 is depicted with cooling fluid CF flowing through the plurality of tubeless micro-channels 137 and an electrical current 'i' flowing from the upper surface 133 to the lower surface 131. That is, electrical current may flow between the semiconductor device 120 bonded to the upper surface 133 and the substrate 110 bonded to the lower surface 131 of the cooling bond layer 130. It should be understood the cooling fluid CF may be a dielectric fluid such that the current i flows around the plurality of tubeless micro-channels 137 as depicted in FIG. 4. Accordingly, the cooling bond layer 130 provides cooling and electrical connectivity for the power electronics assembly 100.

Figure 6:
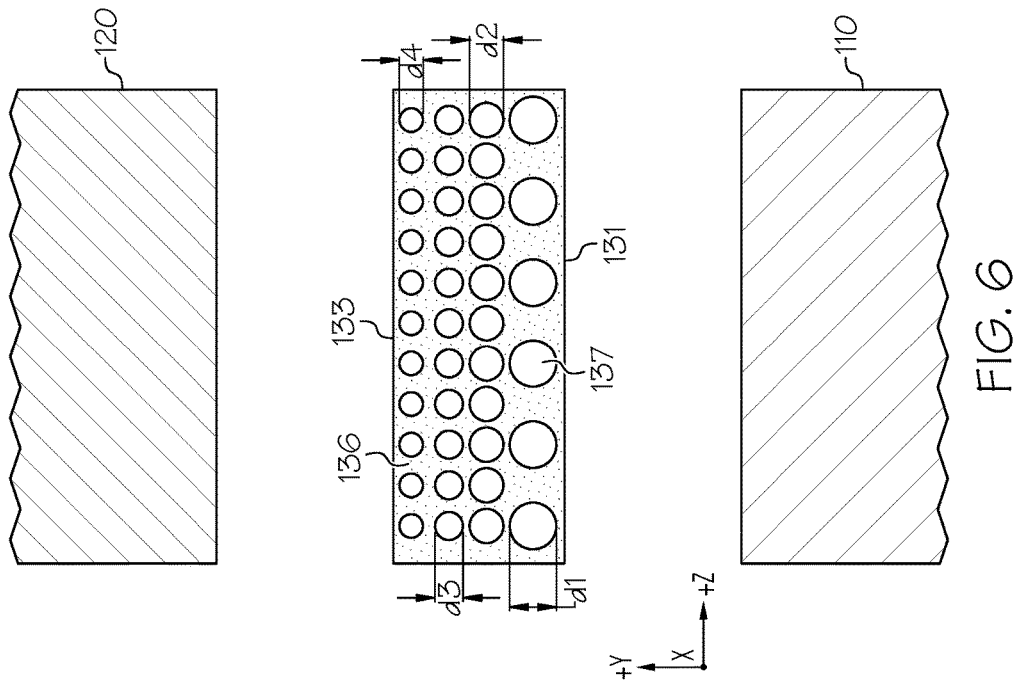
FIG. 6 schematically depicts a view of section 2B-2B layer in FIG. 2A according to one or more embodiments shown and described herein.
Figure 5:
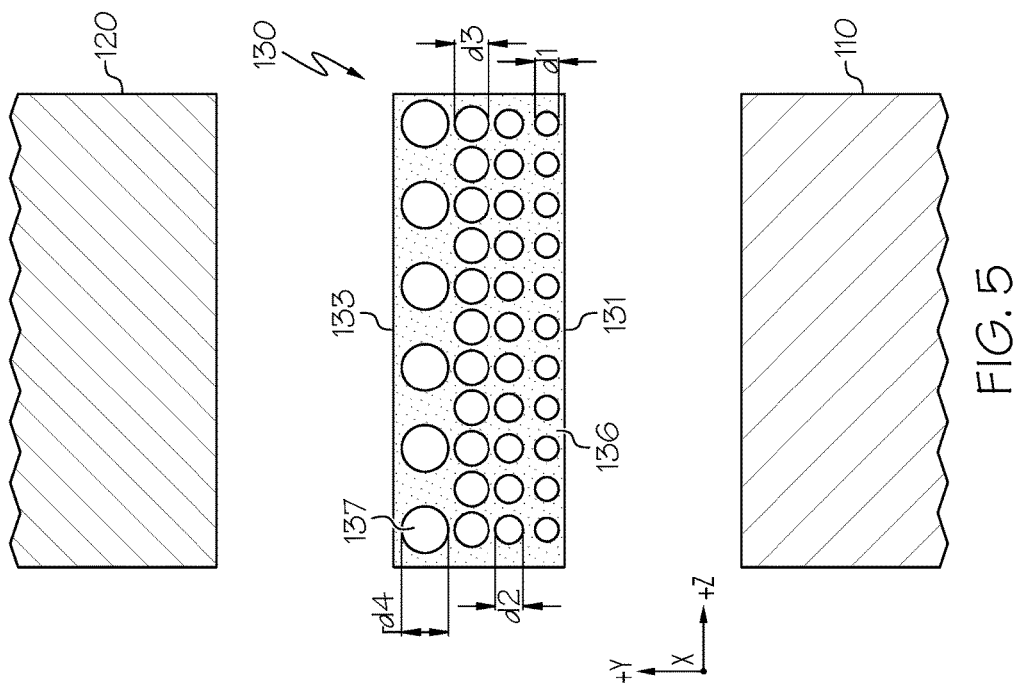
FIG. 5 schematically depicts a view of section 2B-2B layer in FIG. 2A according to one or more embodiments shown and described herein.

While FIGS. 2A, 2B, 3 and 4 depict the plurality of tubeless micro-channels 137 having a generally constant average inner diameter d1 as a function of the thickness (Y direction) of the cooling bond layer 130, in some embodiments, the plurality of tubeless micro-channels 137 may have a graded inner diameter as a function of the thickness (Y direction) of the cooling bond layer 130 as depicted in FIGS. 5-8. For example, FIG. 5 depicts one non-limiting example with four rows of tubeless micro-channels 137 having increasing average inner diameters as a function of the thickness (+Y direction) of the cooling bond layer 130. Particularly, a row of tubeless micro-channels 137 closest to the lower surface 131 (first row) has an average inner diameter of 'd1', a row of tubeless micro-channels 137 just above (+Y direction) the first row (second row) has an average inner diameter of 'd2' greater than d1, a row of tubeless micro-channels 137 just above (+Y direction) the second row (third row) has an average inner diameter of 'd3' greater than d2, and a row of tubeless micro-channels 137 just above (+Y direction) the third row (fourth row) has an average inner diameter of 'd4' greater than d3 (i.e., d1<d2<d3<d4). Accordingly, FIG. 5 depicts a plurality of tubeless micro-channels 137 with an increasing graded average inner diameter as a function of the thickness of the cooling bond layer 130 from the lower surface 131 to the upper surface 133. Referring now to FIG. 6, another non-limiting example with four rows of tubeless micro-channels 137 having decreasing average inner diameters as a function of the thickness (+Y direction) of the cooling bond layer 130 is depicted. Particularly, the first row of tubeless micro-channels 137 has an average inner diameter of 'd1', the second row of tubeless micro-channels 137 has an average inner diameter of 'd2' less than d1, the third row of tubeless micro-channels 137 has an average inner diameter of 'd3' less than d2, and the fourth row of tubeless micro-channels 137 has an average inner diameter of 'd4' less than d3 (i.e., d1>d2>d3>d4). Accordingly, FIG. 6 depicts a plurality of tubeless micro-channels 137 with a decreasing graded average inner diameter as a function of the thickness of the cooling bond layer 130 from the lower surface 131 to the upper surface 133 of the cooling bond layer 130.

Figure 7:
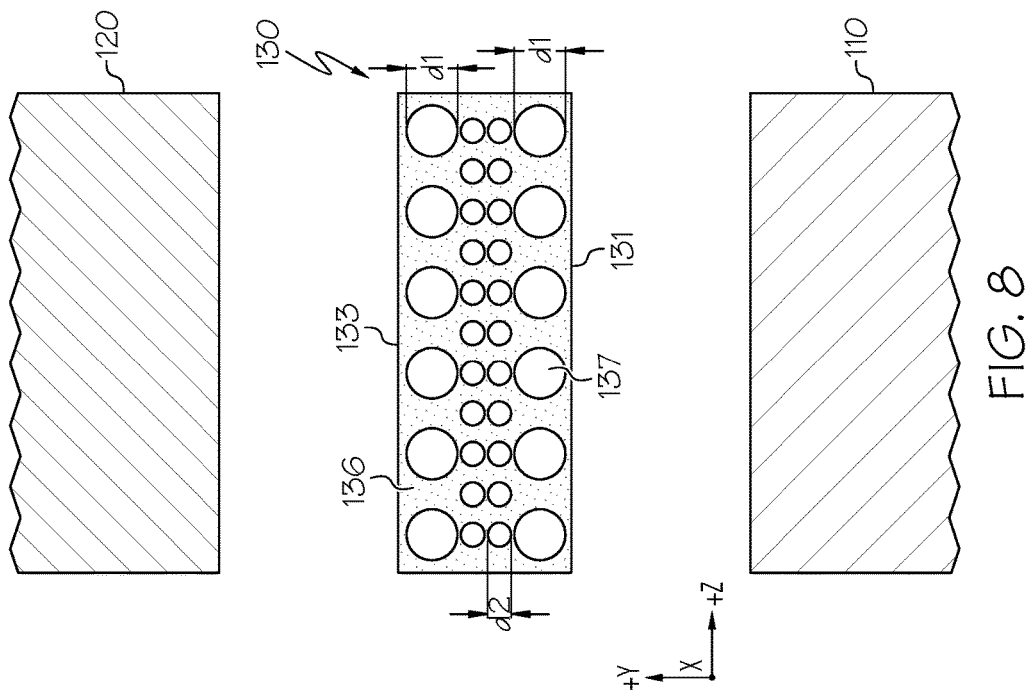
FIG. 7 schematically depicts a view of section 2B-2B layer in FIG. 2A according to one or more embodiments shown and described herein.
Figure 8:
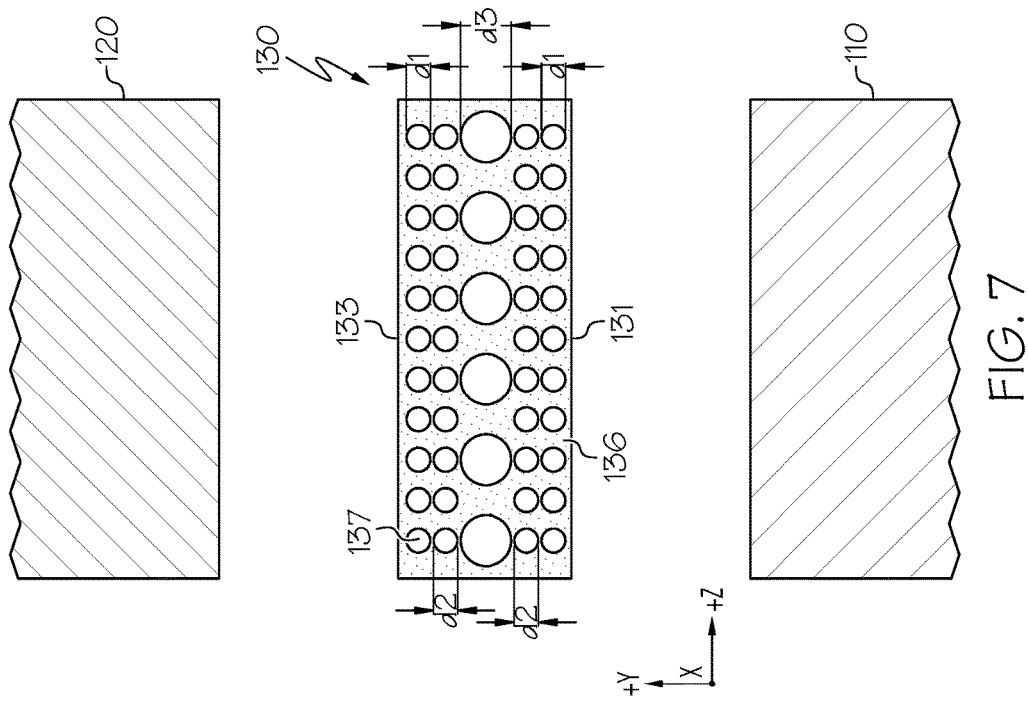
FIG. 8 schematically depicts a view of section 2B-2B layer in FIG. 2A according to one or more embodiments shown and described herein.

Referring now to FIG. 7, a non-limiting example with five rows of tubeless micro-channels 137 comprising a central or middle row of tubeless micro-channels 137 having an average inner diameter that is greater than an average inner diameter of outer rows of tubeless micro-channels 137 is depicted. Particularly, a pair of first rows of tubeless micro-channels 137 closest to the lower surface 131 and the upper surface 133 have an average inner diameter of 'd1', a pair of second rows of tubeless micro-channels 137 next to the pair of first rows of tubeless micro-channels 137 have an average inner diameter of 'd2' that is equal to d1, and a middle row of tubeless micro-channels 137 has an average inner diameter of 'd3' that is greater than d1 and d2 (i.e., d1=d2<d3). Accordingly, FIG. 7 depicts the plurality of tubeless micro-channels 137 with an increasing graded average inner diameter as a function of thickness from the lower surface 131 to the middle or center of the cooling bond layer 130 (+Y direction), and from the upper surface 133 to the middle or center of the cooling bond layer 130 (-Y direction). Referring now to FIG. 8, a non-limiting example with four rows of tubeless micro-channels 137 comprising a pair of outer rows of tubeless micro-channels 137 having an average inner diameter that is greater than an average inner diameter of a pair of inner rows of tubeless micro-channels 137 is depicted. Particularly, a pair of first rows of tubeless micro-channels 137 closest to the lower surface 131 and the upper surface 133 have an average inner diameter of 'd1', and a pair of middle rows of tubeless micro-channels 137 have an average inner diameter of 'd2' that is less than d1 (i.e., d1>d2). Accordingly, FIG. 8 depicts a plurality of tubeless micro-channels 137 with a decreasing graded average inner diameter as a function of thickness from the lower surface 131 to the middle or center of the cooling bond layer 130 (+Y direction), and from the upper surface 133 to the middle or center of the cooling bond layer 130 (-Y direction).

It should be understood that other configurations and examples of the arrangement and average inner diameters of the plurality of tubeless micro-channels 137 may be used to provide a cooling fluid circuit comprising a cooling bond layer. Also, and as noted above, the average inner diameter of the plurality of tubeless micro-channels 137 may be less than 1000 µm. For example, the average inner diameter of the plurality of tubeless micro-channels 137 may be between about 10 µm and about 750 µm. In some embodiments, the average inner diameter of the plurality of tubeless micro-channels 137 may be between about 50 µm and about 500 µm, for example between about 75 µm and about 250 µm.

Figure 9A:
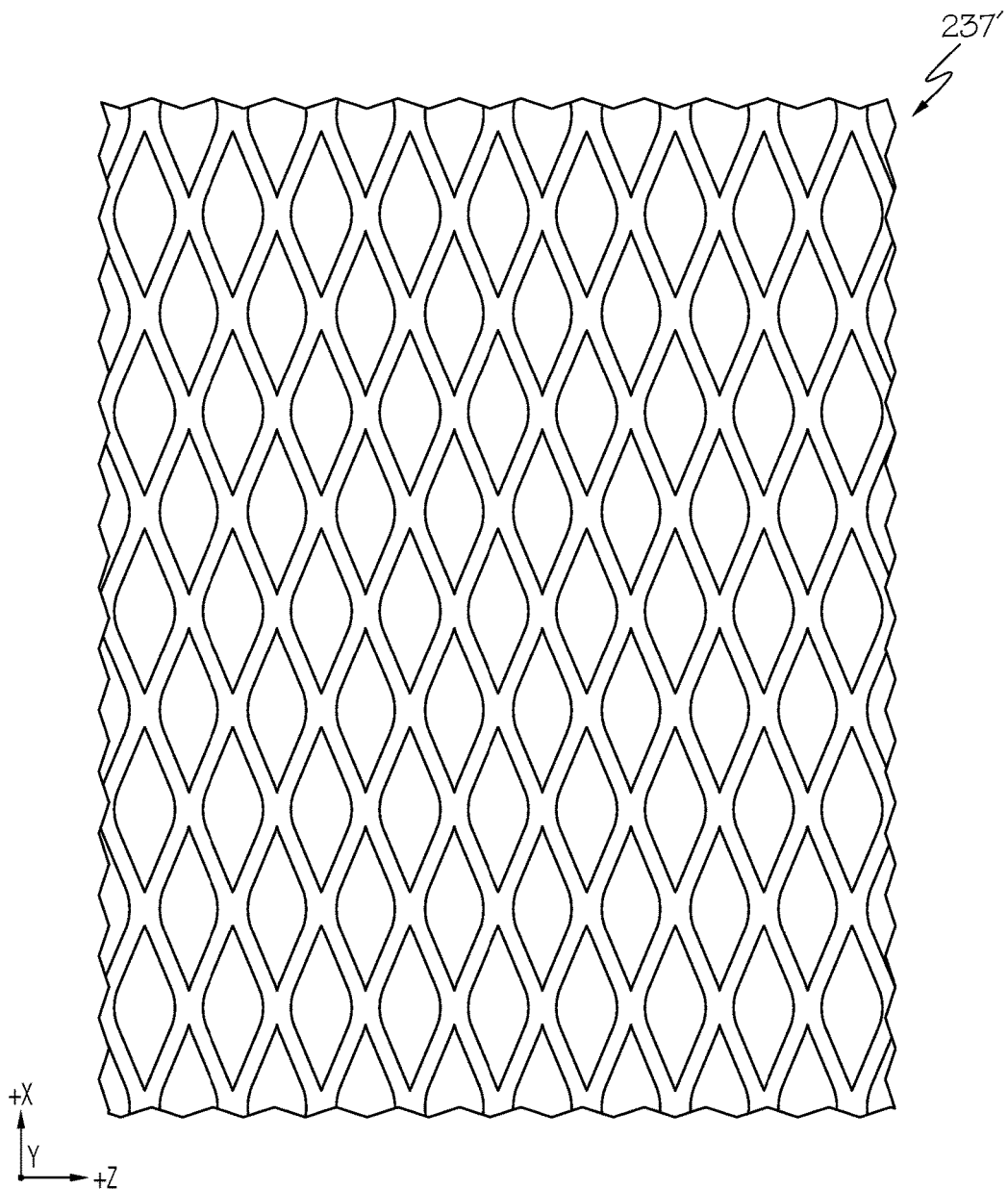
FIG. 9A schematically depicts a top view of a template for a plurality of micro-channels in a cooling bond layer according to one or more embodiments shown and described herein.

Referring now to FIGS. 9A-9C and 10, a non-limiting example of a cooling bond layer with non-cylindrical shaped micro-channels is schematically depicted. Particularly, FIG. 9A schematically depicts a top view of a wire mesh layer 237' used as a template for a plurality of micro-channels 237 in a cooling bond layer 230 depicted in FIGS. 9B-9C and 10. That is, one or more wire mesh layers 237' may be disposed within a metal matrix 236 and then removed to provide a plurality of micro-channels 237 in the form of the wire mesh layers 237'. As used herein the phrase "wire mesh layer" refers to of layer with a mesh structure and not to the material from which the layer is formed. For example, non-limiting examples of materials from which the wire mesh layer 237' is formed include polymers such as nylon, polyimides, polyamide-imides, and the like.

Figure 9B:
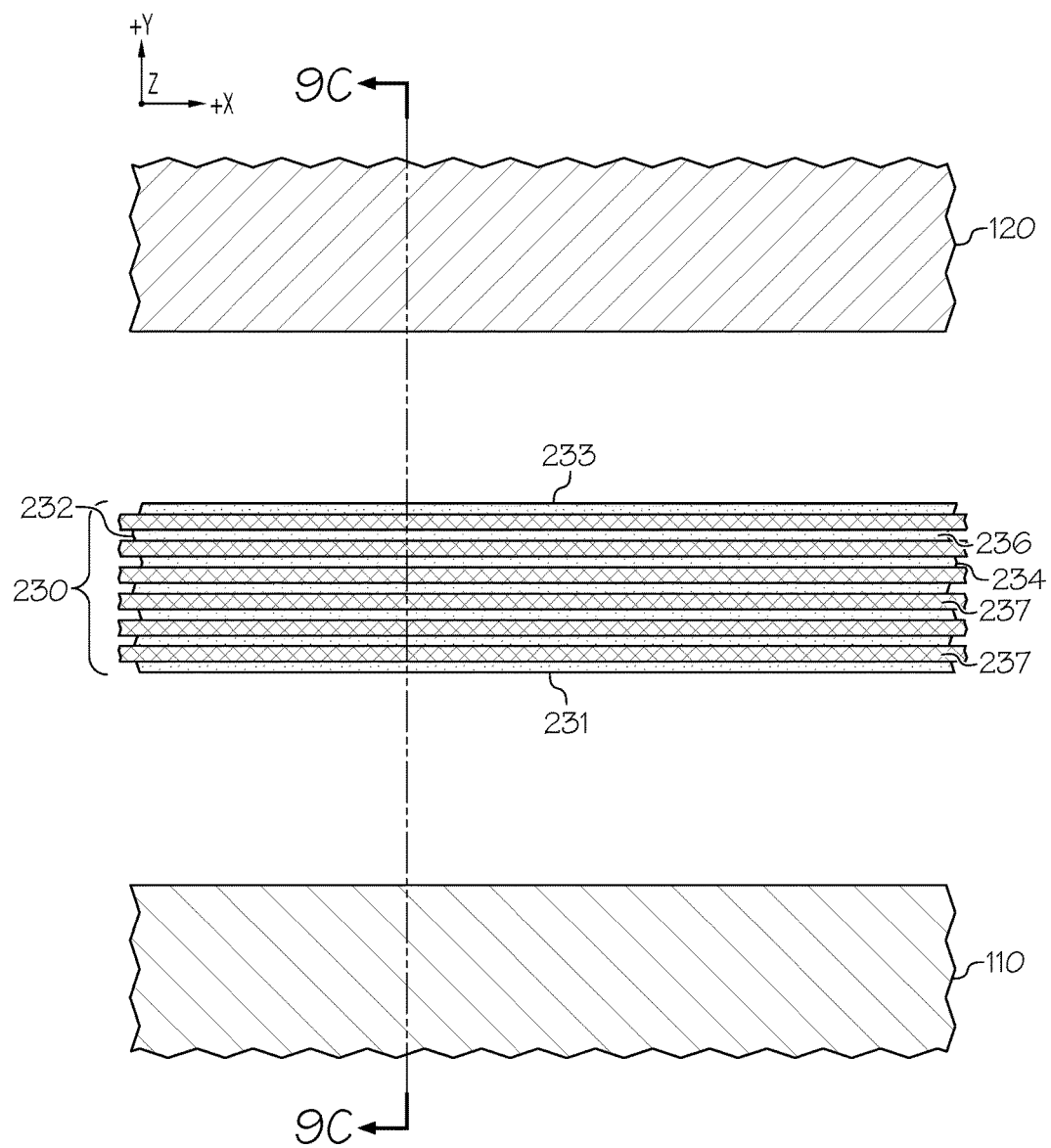
FIG. 9B schematically depicts an exploded side view of the cooling bond layer in FIG. 1 formed using the template in FIG. 9A according to one or more embodiments shown and described herein.
Figure 9C:
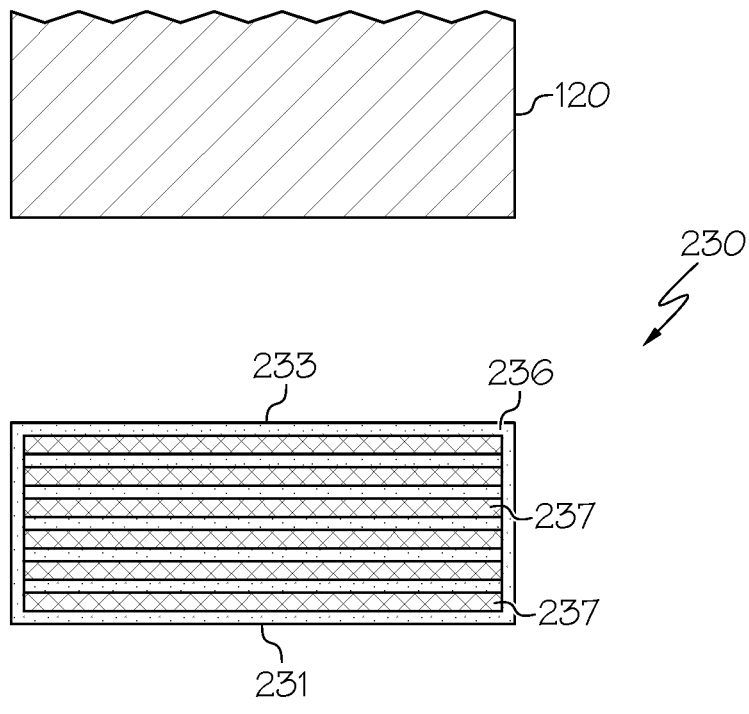
FIG. 9C schematically depicts a view of section 9B-9B layer in FIG. 9A.
Figure 10:
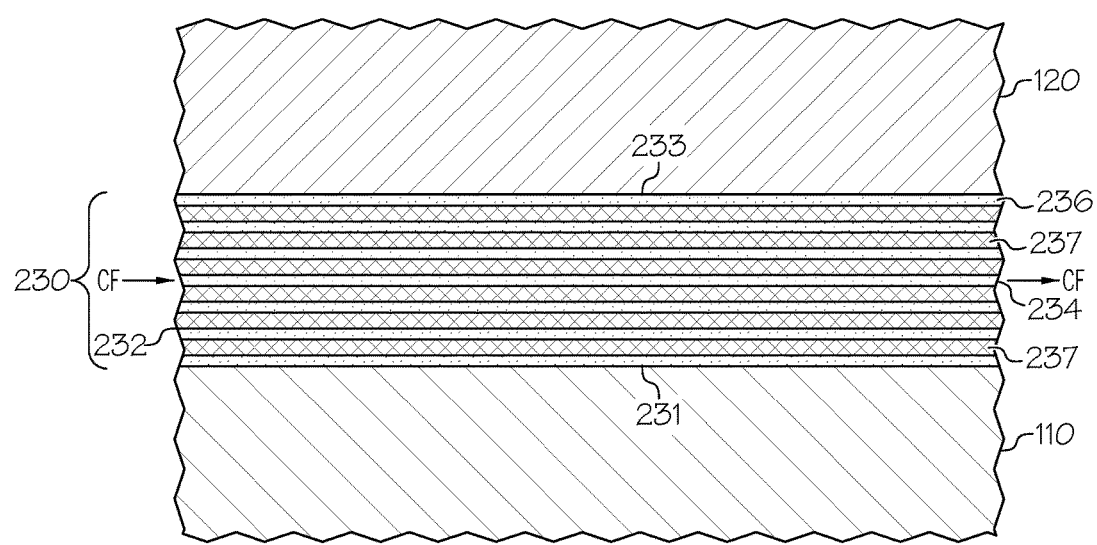
FIG. 10 schematically depicts the cooling bond layer in FIG. 9B bonded to the power electronics assembly according to one or more embodiments shown and described herein.

Referring specifically to FIG. 9B-9C an exploded side view of the region designated by box 150 in FIG. 1 before bonding the semiconductor devices 120 to the substrate 110 is schematically depicted in FIG. 9B and an end view of section 9C-9C in FIG. 9B is schematically depicted in FIG. 9C. In embodiments, the substrate 110 is bonded to the semiconductor device 120 via reflow soldering to form and bond the cooling bond layer 230 to the substrate 110 and to the semiconductor device 120 as discussed in more detail below. The cooling bond layer 230 includes a lower surface 231, an upper surface 233, a first end 232, and a second end 234 spaced apart (+X direction) from the first end 232. The cooling bond layer 230 includes a metal matrix 236 with a plurality of micro-channels 237 disposed within the metal matrix 236 and extending from the first end 232 to the second end 234. As depicted in FIG. 10, a cooling fluid 'CF' may flow through the plurality of micro-channels 237 as part of a cooling fluid circuit 235 comprising the cooling bond layer 230 for the power electronics assembly 100.

In embodiments, the cooling bond layer 230 may be disposed between and in direct contact with the substrate 110 and the semiconductor device 120. Accordingly, the lower surface 231 of the cooling bond layer 230 may be in direct contact with the substrate 110 and the upper surface 233 may be in direct contact with the semiconductor device 120 (FIG. 10). In other embodiments, the cooling bond layer 230 may be disposed between but not be in direct contact with the substrate 110 and the semiconductor device 120. That is, one or more additional layers may be disposed between the lower surface 231 of the cooling bond layer 230 and the substrate 110 and/or one or more additional layers may be disposed between the upper surface 233 and the semiconductor device 120.

While FIGS. 9B, 9C and 10 schematically depicted the plurality of micro-channels 237 having a generally constant thickness (Y direction) as a function of the thickness of the cooling bond layer 230, it should be understood that other configurations and examples of the thickness, pattern, etc., of the plurality of micro-channels 237 may be used to provide a cooling fluid circuit comprising a cooling bond layer. For example, the plurality of micro-channels 237 may have a graded thickness (Y direction) as a function of the thickness of the cooling bond layer 230.

Figure 11A:
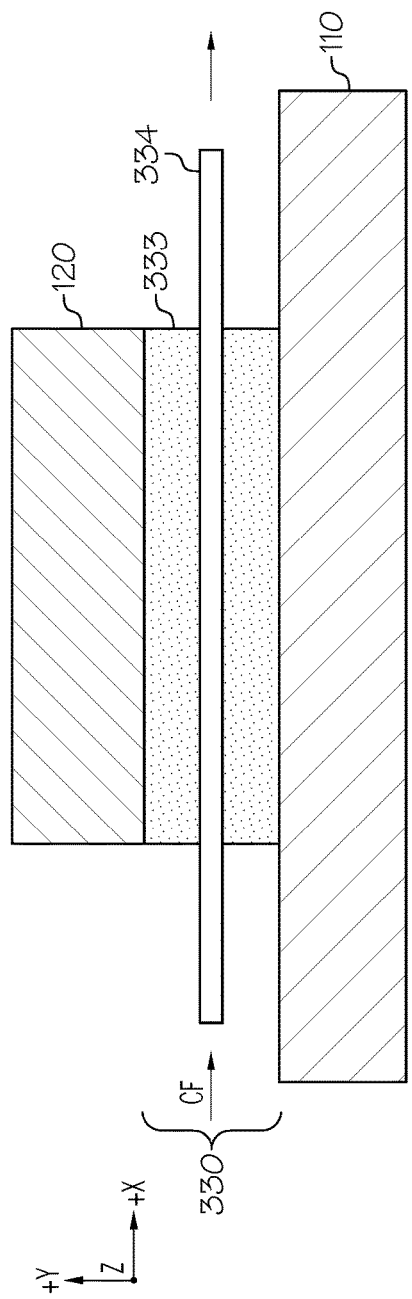
FIG. 11A schematically depicts a side cross section view of the cooling bond layer in FIG. 1 according to one or more embodiments shown and described herein.
Figure 11B:
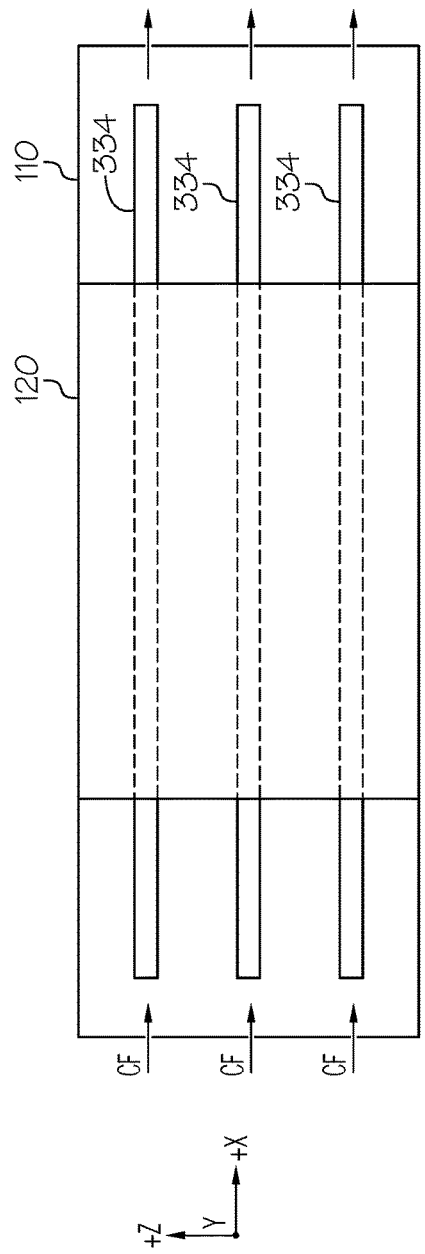
FIG. 11B schematically depicts a top view of the cooling bond layer in FIG. 11A according to one or more embodiments shown and described herein.

Referring now to FIGS. 11A-11B, a non-limiting example of a cooling bond layer with micro-channels in the form of tubing extending through the cooling bond layer is schematically depicted (herein referred to as "tube micro-channels"). Particularly, FIGS. 11A and 11B schematically depict a side cross sectional view and a top view, respectively, of the semiconductor device 120 thermally bonded to the substrate 110 with a cooling bond layer 330. The cooling bond layer 330 includes a metal matrix 333 with a plurality of tubes 334 disposed within and extending through the metal matrix 333 as depicted in FIGS. 11A-11B. That is, the plurality of tubes 334 are disposed within and extend beyond (+/−X directions) the cooling bond layer 330. It should be understood that the plurality of tubes 334 are hollow with inner diameters that form a plurality of tube micro-channels within the metal matrix 333. As depicted in FIGS. 11A-11B, a cooling fluid 'CF' may flow through the plurality of tubes 334 as part of a cooling fluid circuit (not labeled) comprising the cooling bond layer 330 for the power electronics assembly 100. It should be understood that electrical current may flow between a lower surface (not labeled) and an upper surface (not labeled) of the cooling bond layer 330 as described above with respect to the cooling bond layer 130 and FIG. 4.

In embodiments, the cooling bond layer 330 may be disposed between and in direct contact with the substrate 110 and the semiconductor device 120. In other embodiments, the cooling bond layer 330 may be disposed between but not be in direct contact with the substrate 110 and the semiconductor device 120. That is, one or more additional layers may be disposed between the cooling bond layer 330 and the substrate 110 and/or one or more additional layers may be disposed between the cooling bond layer 330 and the semiconductor device 120. One non-limiting example includes a Ni layer on the substrate 110 and/or the semiconductor device 120 to assist in bonding with the cooling bond layer 330.

Referring now to FIGS. 12A-12B, a process for forming the cooling bond layer 130 and the power electronics assembly 100 is schematically depicted. Particularly, a side view of a process for forming the cooling bond layer 130 and the power electronics assembly 100 is schematically depicted in FIG. 12A and an end view of the process depicted in FIG. 12A is shown in FIG. 12B. At step 10 a template 139 for the plurality of tubeless micro-channels 137 and a soldering material is positioned between the substrate 110 and the semiconductor device 120. The template 139 may comprise a plurality of cylindrical shaped members 137', e.g., cylindrical shaped rods or tubes. In the alternative, or in addition to, the template 139 may comprise a plurality of non-cylindrical shaped members (not shown). In embodiments, the soldering material may be electrolytically or electrolessly deposited layers of soldering material on the substrate 110 and the semiconductor device 120. For example, the upper surface (+Y direction) of the substrate 110 and the lower surface (−Y direction) of the semiconductor device 120 may be electroplated with a thin layer of Ni (not shown), after which a layer of soldering material (not shown) is electrolytically or electrolessly deposited onto the Ni layers to provide a pair of Sn soldering layers. In other embodiments, a layer of soldering material paste (not shown) is disposed on the upper surface of the substrate 110, the plurality of cylindrical shaped members 137' are positioned onto the layer of soldering paste, and the semiconductor device 120 is positioned onto the plurality of cylindrical shaped members 137'. In still other embodiments, a first foil of soldering material (not shown) is positioned on the upper surface of the substrate 110, the plurality of cylindrical shaped members 137' are positioned onto the first foil of soldering paste, a second foil of soldering material is positioned on the plurality of cylindrical shaped members 137', and the semiconductor device 120 is positioned on the second foil of soldering material.

At step 12 the cooling bond layer 130 is formed and the substrate 110 is thermally bonded to the semiconductor device 120. One non-limiting process for forming the cooling bond layer 130 and thermally bonding the substrate 110 to the semiconductor device 120 is the reflow soldering process. Particularly, the substrate 110, plurality of cylindrical shaped members 137', soldering material, and semiconductor device 120 may be placed in an oven or furnace and heated to a soldering temperature above the melting point of the soldering material. At the soldering temperature the soldering material melts, flows around the plurality of cylindrical shaped members 137' and forms the metal matrix 136 around the plurality of cylindrical shaped members 137' when the liquid soldering material solidifies. That is, during the reflow soldering process at step 12 the soldering material melts and flows between the plurality of cylindrical shaped members 137' and forms the metal matrix 136. In embodiments, the soldering material is a Sn soldering material such as a Sn87/10In/3Ag alloy with a solidus temperature of about 204° C., a Sn92/B5i/Cu3 alloy with a solidus temperature of about 211° C., a Sn95.5/Ag4/Cu0.5 alloy with a solidus temperature of about 217° C., and the like.

In embodiments, for example when the plurality of cylindrical shaped members 137' are cylindrical shaped rods or tubes, the cylindrical shaped members 137' may be removed from the metal matrix 136 to form the cooling bond layer 130 with the plurality of tubeless micro-channels 137. For example, the cylindrical shaped members 137' may be formed from material that does not wet or is not wet by the liquid soldering material during the reflow soldering process. Accordingly, the plurality of cylindrical shaped members 137' can be mechanically removed by applying a force to one end of the cylindrical shaped members 137' and pushing the cylindrical shaped members 137' out of the metal matrix 136 as depicted at step 14. As used herein, the term "wet" refers to a surface bonding to liquid soldering material via a diffusion reaction between the surface and the liquid surface material. Accordingly, a material that does not wet during the reflow soldering process does form a surface bond with the liquid soldering material during the reflow soldering process. Non-limiting examples of materials that do not wet during the reflow soldering process include graphite, stainless steel and the like. In the alternative, or in addition to, the cylindrical shaped members 137' may be removed by etching the cylindrical shaped members 137' out of the metal matrix 136 (not shown) to form the cooling bond layer 130 with the plurality of tubeless micro-channels 137.

Referring now to FIGS. 13A-13B, a process for forming the cooling bond layer 230 and the power electronics assembly 100 is schematically depicted. Particularly, a side view of a process for forming the cooling bond layer 230 and the power electronics assembly 100 is schematically depicted in FIG. 13A. FIG. 13A and an end view of the process depicted in FIG. 13A is shown in FIG. 13B. At step 20 a template 239 for the plurality of micro-channels 237 and soldering material are positioned between the substrate 110 and the semiconductor device 120. The template 239 may comprise a plurality of wire mesh layers 237'. Similar to the cooling bond layer 130 discussed above with reference to FIGS. 12A-12B, the cooling bond layer 230 may be formed during a reflow soldering process in which liquid soldering material flows around the plurality of wire mesh layers 237'. The plurality of wire mesh layers 237' are removed from the metal matrix 236 to form the cooling bond layer 230 with the plurality of micro-channels 237 at step 24. For example, the template 239 may be removed by dissolving the plurality of wire mesh layers 237'.

Referring now to FIGS. 14A-14B, a process for forming the cooling bond layer 330 and the power electronics assembly 100 is schematically depicted. Particularly, a side view of a process for forming the cooling bond layer 330 and the power electronics assembly 100 is schematically depicted in FIG. 14A. FIG. 14A and an end view of the process depicted in FIG. 14A is shown in FIG. 14B. At step 30 a first solder material foil 331, a plurality of tubes 334 and a second solder material foil 332 are positioned between the substrate 110 and the semiconductor device 120. The first solder material foil 331 is position on the substrate 110 as are stand-offs 340 for supporting and positioning the plurality of tubes 334 above (+Y direction) the substrate 110 as depicted in FIG. 14A. At step 32 the plurality of tubes 334 are positioned in contact with the first solder material foil 331, the second solder material foil 332 is positioned in contact with the plurality of tubes 334, and the semiconductor device 120 is positioned in contact with the second solder material foil 332 to form a soldering assembly (not labeled). The soldering assembly is heated to an elevated temperature (e.g., a soldering temperature) where the first solder material foil 331 and the second solder material foil 332 melt and from a metal matrix 333 (e.g., a single solder layer) with the plurality of tubes 334 disposed there within at step 34. As shown at step 34, the plurality of tubes 334 are not removed from the metal matrix 333 and thereby provided the plurality of micro-channels configured for a cooling fluid to flow through and remove heat from the cooling bond layer 330.

In embodiments, the first solder material foil 331 and the second solder material foil 332 may each comprise a tin (Sn) alloy layer with a thickness (Y direction) between about 50 μm and about 500 μm, the plurality of tubes may include Sn plated oxide coated stainless steel tubes, and the soldering temperature may be between about 200° C. and about 250° C. One non-limiting example includes a first solder material foil 331 formed from a Sn alloy and having a thickness of about 100 μm, a second solder material foil 332 formed from a Sn alloy and having a thickness of about 200 μm, and a plurality of stainless steel tubes 334 with an inner diameter of about 80 μm. The plurality of stainless steel tubes 334 may be plated with Ni and/or Sn. It should be understood that solder material layers formed form different alloys and having different thicknesses, and tubes with different diameters, may be utilized.

Figure 15:
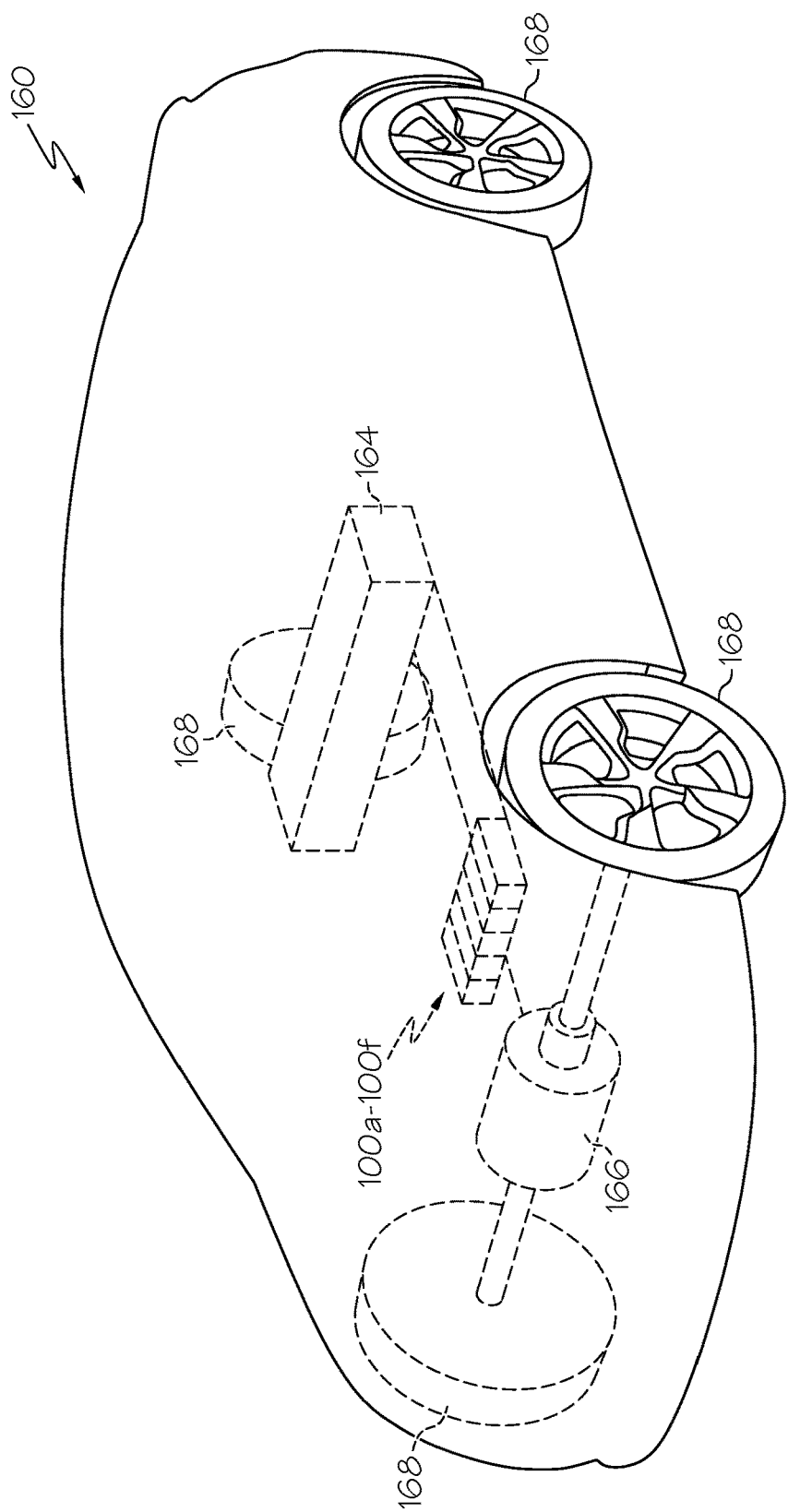
FIG. 15 schematically depicts a vehicle having a plurality of power electronics assemblies according to one or more embodiments shown and described herein.

As stated above, the power electronics assemblies described herein may be incorporated into an inverter circuit or system that converts direct current electrical power into alternating current electrical power and vice versa depending on the particular application. For example, in a hybrid electric vehicle application as illustrated in FIG. 15, several power electronics assemblies 100a-100f may be electrically coupled together to form a drive circuit that converts direct current electrical power provided by a bank of batteries 164 into alternating electrical power that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation thereby requiring cooling of the semiconductor devices. The cooling bond layers described and illustrated herein may be used as part of a cooling fluid circuit to cool the semiconductor devices while also providing a compact package design.

It should now be understood that the cooling bond layers in the power electronics assemblies and vehicles described herein may be utilized for cooling semiconductor devices without the need for complex cooling circuits, thereby providing for a more compact package design. Particularly, the cooling bond layers described herein may be bonded to semiconductor devices that generate heat during operation and the plurality of micro-channels within the cooling bond layers are configured for fluid to flow through the cooling bond layers thereby removing heat from the semiconductor devices.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A bond layer for a power electronics assembly comprising:
   a cooling bond layer comprising:
      a first end and a second end spaced apart from the first end;
      a metal matrix extending between the first end and the second end; and
      a plurality of micro-channels extending through the metal matrix from the first end to the second end;
   wherein the plurality of micro-channels extend from the first end to the second end of the cooling bond layer and comprise one of a constant average inner diameter or a graded average inner diameter as a function of a thickness of the cooling bond layer, and wherein the plurality of micro-channels are configured for a cooling fluid to flow through and remove heat from the cooling bond layer.

2. The bond layer of claim 1, wherein the plurality of micro-channels comprise a plurality of cylindrical shaped micro-channels.

3. The bond layer of claim 2, wherein the plurality of cylindrical shaped micro-channels comprise a plurality of tubes extending through the metal matrix.

4. The bond layer of claim 1, wherein the plurality of micro-channels comprises a wire mesh structure.

5. The bond layer of claim 1, further comprising a pair of low melting point bond layers, wherein the cooling bond layer is sandwiched between the pair of low melting point bond layers.

6. The bond layer of claim 5, wherein:
the cooling bond layer has a melting point above a sintering temperature;
the pair of low melting point bond layers each have a melting point below the sintering temperature; and
the sintering temperature is in a range between about 280° C. and 350° C.

7. A power electronics assembly comprising:
a substrate;
a semiconductor device; and
a cooling bond layer disposed between and bonded to the semiconductor device and the substrate, the cooling bond layer comprising a first end and a second end spaced apart from the first end, a metal matrix extending between the first end and the second end, and a plurality of micro-channels extending through the metal matrix from the first end to the second end, wherein the plurality of micro-channels extend from the first end to the second end of the cooling bond layer and comprise one of a constant average inner diameter or a graded average inner diameter as a function of a thickness of the cooling bond layer; and
a cooling fluid circuit extending through the cooling bond layer, the cooling fluid circuit comprising the plurality of micro-channels.

8. The power electronics assembly of claim 7, wherein the plurality of micro-channels comprise a plurality of cylindrical shaped micro-channels.

9. The power electronics assembly of claim 8, wherein the plurality of cylindrical shaped micro-channels comprise a plurality of oxide coating tubes extending through the metal matrix.

10. The power electronics assembly of claim 7, wherein the plurality of micro-channels comprise a wire mesh structure.

11. The power electronics assembly of claim 7, wherein the metal matrix is formed from tin, aluminum, nickel, copper, magnesium, or alloys thereof.

12. A process for manufacturing a power electronics assembly comprising:
positioning a template for a plurality of micro-channels between a substrate and a semiconductor device;
depositing a metal or an alloy around the template and forming a metal matrix, wherein the metal matrix is bonded to the substrate and the semiconductor device;
removing the template from the metal matrix and forming a cooling bond layer disposed between and bonded to the semiconductor device and the substrate, the cooling bond layer comprising a first end, a second end spaced apart from the first end and the metal matrix extending between the first end and the second end, and the plurality of micro-channels extending through the metal matrix from the first end to the second end, wherein the plurality of micro-channels extend from the first end to the second end of the cooling bond layer and comprise one of a constant average inner diameter or a graded average inner diameter as a function of a thickness of the cooling bond layer, and wherein the plurality of micro-channels are configured for a cooling fluid to flow through and remove heat from the cooling bond layer and form at least part of a cooling fluid circuit for the power electronics assembly.

13. The process of claim 12, wherein the metal or the alloy is deposited around the template by electrolytic deposition or electroless deposition and the cooling bond layer is bonded to the substrate and the semiconductor device via the electrolytic deposition or the electroless deposition.

14. The process of claim 12, wherein the template of the plurality of micro-channels comprises a plurality of cylindrical shaped members.

15. The process of claim 14, wherein the template is removed via etching of the plurality of cylindrical shaped members out of the metal matrix.

16. The process of claim 14, wherein the template is removed by applying a mechanical force onto the plurality of cylindrical shaped members.

17. The process of claim 12, wherein the template of the cooling bond layer comprises a plurality of wire mesh layers.

* * * * *